United States Patent [19]

Fujisaki

[11] 4,278,954
[45] Jul. 14, 1981

[54] SUPPRESSED CARRIER MODULATOR USING DIFFERENTIAL AMPLIFIER

[75] Inventor: Hitoshi Fujisaki, Kodaira, Japan

[73] Assignee: Hitachi Denshi Kabushiki Kaisha, Tokyo, Japan

[21] Appl. No.: 76,609

[22] Filed: Sep. 18, 1979

[30] Foreign Application Priority Data

Sep. 22, 1978 [JP] Japan .............................. 53-116014

[51] Int. Cl.³ .......................... H03C 1/42; H03C 1/54
[52] U.S. Cl. .................................. 332/9 T; 332/31 T; 332/41; 332/44
[58] Field of Search ............. 332/9 T, 31 T, 41, 43 B, 332/48, 44; 455/108, 109; 375/41, 43

[56] References Cited

U.S. PATENT DOCUMENTS

| 3,229,230 | 1/1966 | Feldman | 332/43 B X |
| 3,550,040 | 12/1970 | Sinusas | 332/44 |
| 4,142,162 | 2/1979 | Huntley | 332/44 X |

*Primary Examiner*—Siegfried H. Grimm

*Attorney, Agent, or Firm*—Blakely, Sokoloff, Taylor & Zafman

[57] ABSTRACT

The modulation system comprises emitter coupled first to fourth transistor pairs of one type, emitter coupled fifth and sixth transistor pairs of the other type, and a differential amplifier. The first and second transistor pairs are connected to the fifth transistor pair by emitter follower connections and the third and fourth transistor pairs are also connected to the sixth transistor pairs through emitter follower connections. The outputs of the fifth and sixth transistor pairs are coupled to paired input terminals of the differential amplifier. A modulation signal is applied to the transistors of the first and fourth transistor pairs. A signal to be modulated is supplied to the transistors of the first and third transistor pairs and DC voltage is supplied to the base electrodes of the transistors of the second and third transistor pairs. Further, a signal to be modulated and having an opposite phase to the first mentioned signal to be modulated is applied to transistors of the second and fourth transistor pairs, thus producing a suppressed carrier modulated output signal from the differential amplifier.

3 Claims, 3 Drawing Figures

SUPPRESSED CARRIER MODULATOR USING DIFFERENTIAL AMPLIFIER

BACKGROUND OF THE INVENTION

This invention relates to suppressed carrier modulation systems and more particularly a modulation system capable of providing a modulator having a small carrier leak and small higher harmonic component and a wide dynamic range.

One example of a prior art suppressed carrier modulation system will first be described with reference to FIG. 1 of the accompanying drawing which comprises an input terminal $IN_1$ supplied with a modulation signal, another input terminal $IN_2$ supplied with a signal to be modulated and an output terminal OUT for producing a modulated output signal. There are provided a transistor $Q_1$ having a base electrode connected to the input terminal $IN_1$, a transistor $Q_2$ with its base electrode connected to a source of DC voltage $E_1$ and its emitter electrode connected to the emitter electrode of transistor $Q_1$ via a resistor $R_1$, and transistors $Q_3$ and $Q_4$ which constitute a constant current source for the transistors $Q_1$ and $Q_2$ with their base electrodes connected to a source of DC voltage $E_2$ and emitter electrodes grounded respectively through resistors $R_3$ and $R_4$. There are also provided transistors $Q_5$, $Q_6$ and $Q_7$, $Q_8$ with their emitter electrodes connected with each other. The base electrodes of transistors $Q_5$ and $Q_8$ are connected in common to the input terminal $IN_2$ while commonly connected emitter electrodes of transistors $Q_5$, $Q_6$ and $Q_7$, $Q_8$ are connected to the collector electrodes of transistors $Q_1$ and $Q_2$, respectively. The base electrodes of transistors $Q_6$ and $Q_7$ are connected in common to one pole of a source of DC voltage $E_3$ whereas the collector electrode of transistor $Q_6$ is connected to the collector electrode of transistor $Q_8$ and to the output terminal OUT. A source of supply $V_{cc}$ is connected directly to the collector electrodes of transistors $Q_5$ and $Q_7$ and is also connected to the collector electrode of transistor $Q_8$ via a resistor $R_2$.

When a modulation signal is supplied to the base electrode of transistor $Q_1$, and when a signal to be modulated is supplied to the base electrodes of transistors $Q_5$ and $Q_8$, a modulated output signal is derived out from the collector electrodes of transistors $Q_6$ and $Q_8$.

The modulation system having a construction described above, however, encounters a problem that the carrier leak, i.e., the leakage of the carrier occurring when the modulation signal supplied to the input terminal $IN_1$ is zero becomes large. The carrier leak is determined by the difference in the collector currents of transistors $Q_1$ and $Q_2$ and a load resistance so that there are many causes that increase the carrier leak, such as the difference in the base-emitter voltages $V_{BE}$ of transistors $Q_3$ and $Q_4$ which constitute the constant current source, the difference in the resistance ratio between emitter resistors $R_3$ and $R_4$ of transistors $Q_3$ and $Q_4$, the difference in the base bias voltage of transistors $Q_1$ and $Q_2$ and the difference in the base-emitter voltages of transistors $Q_1$ and $Q_2$. Therefore, such a modulation system requires sophisticated adjustment and can not be used satisfactorily. Moreover, since the transistors are connected in cascade of three stages, the dynamic range of the modulation system is narrow and it is difficult to operate it with low source voltage.

SUMMARY OF THE INVENTION

Accordingly, it is an object of this invention to provide a novel suppressed carrier modulation system having a large dynamic range even with a low source voltage.

Another object of this invention is to provide an improved suppressed carrier modulation system which can readily be fabricated with an integrated circuit for providing sufficient reduction in the carrier leak without relying on sophisticated adjustments.

According to this invention, there is provided a suppressed carrier modulation system comprising first, second, third and fourth transistor pairs with emitters of each pair coupled; fifth and sixth transistor pairs with emitters of each pair coupled; a differential amplifier; means for connecting base electrodes of the transistors of the fifth transistor pair to respective emitter electrodes of the first and second transistor pairs; means for connecting base electrodes of the transistors of the sixth transistor pair to respective emitter electrodes of the third and fourth transistor pairs; means for connecting emitter electrodes of the fifth and sixth transistor pairs to a pair of input terminals of the differential amplifier, respectively; means for applying a clamped modulation signal to a base electrode of a first transistor of the first transistor pair and to a base electrode of a second transistor of the fourth transistor pair; means for applying a signal to be modulated to base electrodes of respective second transistors of the first and third transistor pairs; means for applying direct current voltage to a base electrode of the second transistor of the second transistor pair and to a base electrode of the first transistor of the third transistor pair; and means for applying a signal to be modulated to respective base electrodes of the first transistors of the second and fourth transistor pairs, the last mentioned signal to be modulated having a phase opposite to that of the first mentioned signal to be modulated supplied to the respective base electrodes of the second transistors of the first and third transistor pairs, thereby producing a suppressed carrier modulated output signal on an output terminal of the differential amplifier.

DESCRIPTION OF THE PREFERRED EMBODIMENT

Figure 2:
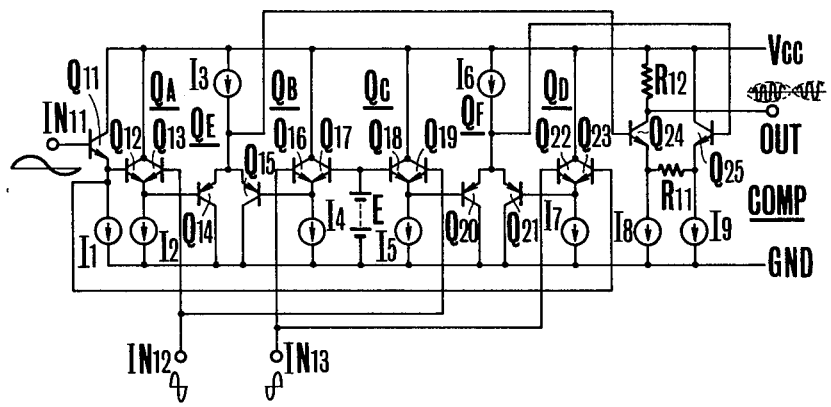
FIG. 2 is a connection diagram showing one embodiment of the modulation system according to this invention.

A preferred embodiment of this invention shown in FIG. 2 comprises an input terminal $IN_{11}$ connected to receive a clamped modulation signal, input terminals $IN_{12}$ and $IN_{13}$ respectively connected to receive signals to be modulated which are mutually out of phase by 180°, an output terminal OUT for deriving out an modulated output signal, a source of supply $V_{cc}$, and a grounding line GND. An NPN transistor $Q_{11}$ is provided to form an emitter follower circuit, the emitter electrode thereof being connected to a constant current source $I_1$. Transistor pairs $Q_{12}$, $Q_{13}$; $Q_{16}$, $Q_{17}$; $Q_{18}$, $Q_{19}$ and $Q_{22}$, $Q_{23}$ are each coupled at emitters to form NPN non-additive mixing circuits (NPN NAM) whereas transistor pairs $Q_{14}$, $Q_{15}$ and $Q_{20}$, $Q_{21}$ coastitute PNP NAM circuits. Transistors $Q_{24}$ and $Q_{25}$ constitute a differential amplifier COMP. Constant current sources $I_2$, $I_3$, $I_4$, $I_5$, $I_6$, $I_7$, $I_8$ and $I_9$ are provided for transistor pairs $Q_{12}$, $Q_{13}$; $Q_{14}$, $Q_{15}$; $Q_{16}$, $Q_{17}$; $Q_{18}$, $Q_{19}$; $Q_{20}$, $Q_{21}$; $Q_{22}$, $Q_{23}$ and transistors $Q_{24}$ and $Q_{25}$, respectively. A resistor $R_{11}$ is connected between emitter electrodes of transistors $Q_{24}$ and $Q_{25}$, whereas a resistor $R_{12}$ is connected between the collector electrode of transistor $Q_{24}$ and the source $V_{cc}$. Thus, the modulator is constituted by NPN type transistor pairs $Q_A$, $Q_B$, $Q_C$ and $Q_D$ which are emitter coupled, PNP type transistor pairs $Q_E$ and $Q_F$ which are emitter coupled, differential amplifier, means for applying the signals to be modulated having opposite phases, and means for applying the clamped modulation signal.

Commonly connected emitter electrodes of the NPN type transistor pair $Q_A$ ($Q_{12}$, $Q_{13}$) and NPN type transistor pair $Q_B$ ($Q_{16}$, $Q_{17}$) are respectively connected to the base electrodes of transistors $Q_{14}$ and $Q_{15}$ constituting the PNP type transistor pair $Q_E$, while the commonly connected emitter electrodes of the NPN type transistor pair $Q_C$ ($Q_{18}$, $Q_{19}$) and NPN type transistor pair $Q_D$ ($Q_{22}$, $Q_{23}$) are respectively connected to the base electrodes of transistors $Q_{20}$ and $Q_{21}$ which constitute the PNP type transistor pair $Q_F$. The commonly connected emitter electrodes of these PNP type transistor pairs $Q_E$ and $Q_F$ are respectively connected to a pair of input terminals of the differential amplifier COMP, that is, respective base electrodes of the transistors $Q_{24}$ and $Q_{25}$.

The clamped modulation signal from the input terminal $IN_{11}$ is applied to the base electrode of transistor $Q_{12}$ comprising the NPN type transistor pair $Q_A$ and to the base electrode of transistor $Q_{23}$ comprising the NPN type transistor pair $Q_D$ via transistor $Q_{11}$. The signal to be modulated applied to the input terminal $IN_{12}$ is applied to the base electrode of transistor $Q_{13}$ comprising the NPN type transistor pair $Q_A$ and also to the base electrode of transistor $Q_{19}$ comprising the NPN type transistor pair $Q_C$. The base electrode of transistor $Q_{17}$ comprising the NPN type transistor pair $Q_B$ and the base electrode of transistor $Q_{18}$ comprising the NPN type transistor pair $Q_C$ are supplied with a suitable DC voltage from a bias voltage source E. A signal to be modulated impressed upon the input terminal $IN_{13}$ and having a polarity opposite to that of the signal to be modulated impressed upon the input terminal $IN_{12}$ is coupled with the base electrode of transistor $Q_{16}$ comprising the NPN type transistor $Q_B$ and with the base electrode of transistor $Q_{22}$ comprising the NPN type transistor pair $Q_D$, whereby a modulated output signal is derived out from the output terminal of the differential amplifier COMP, that is, the collector electrode of transistor $Q_{24}$.

Figure 3:
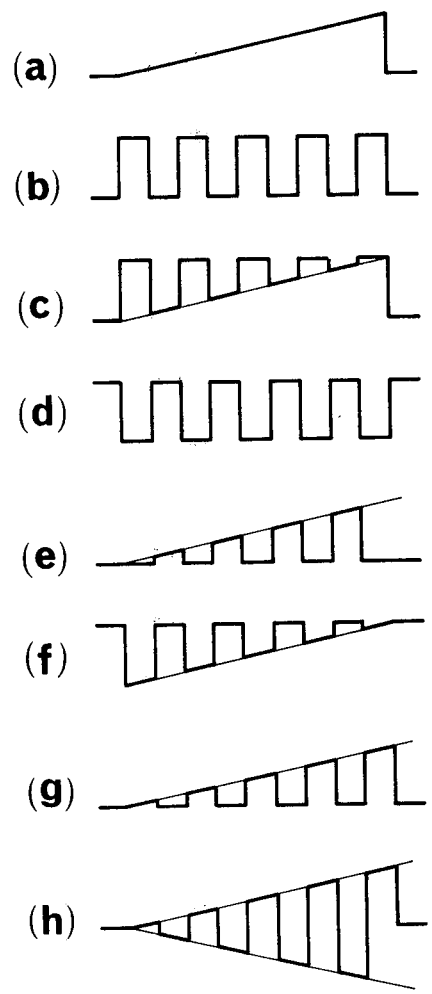
FIG. 3 illustrates in sections (a) through (h) wave forms at various points of the embodiment shown in FIG. 2.

FIG. 3 shows in section (a) the wave form of the base voltage of transistors $Q_{12}$ and $Q_{23}$, in section (b) the base voltage of transistors $Q_{13}$ and $Q_{19}$, in section (c) the base voltage of transistor $Q_{14}$, in section (d) the wave form of the base voltage of transistors $Q_{16}$ and $Q_{22}$, in section (e) the wave form of the base voltage of transistor $Q_{24}$, in section (f) the wave form of the base voltage of transistor $Q_{21}$, in section (g) the wave form of the base voltage of transistor $Q_{25}$, and in section (h) the wave form of the collector current of transistor $Q_{24}$.

The operation of the embodiment shown in FIG. 2 will now be described with reference to FIG. 3. More particularly, the clamped modulation signal supplied to the input terminal $IN_{11}$ is sent to the base electrode of transistor $Q_{12}$ via transistor $Q_{11}$ which is connected to form an emitter follower circuit (see FIG. 3, (a)). Since the signal to be modulated which is received by the input terminal $IN_{12}$ is applied to the base electrode of transistor $Q_{13}$ (see FIG. 3, (b)), the modulation signal is switched by the signal to be modulated so that a signal having a wave form as shown in FIG. 3 at (c) will be applied to the base electrode of the transistor $Q_{14}$. On the other hand, the signal to be modulated (see FIG. 3, (d)) received by the input terminal $IN_{13}$ and having a phase opposite to that of the signal to be modulated received by the input terminal $IN_{12}$ is supplied to the base electrode of transistor $Q_{16}$ so that the base voltage of transistor $Q_{15}$ will also have the wave form as shown in FIG. 3 at (d). As a consequence, the base voltages of the transistors $Q_{15}$ and $Q_{16}$ are mixed with each other at the emitter electrodes of the PNP NAM circuit to form a signal as shown in FIG. 3 at (e) which is applied to the base electrode of transistor $Q_{24}$ of the differential amplifier COMP.

The same modulation signal as that supplied to the base electrode of transistor $Q_{12}$ (see FIG. 3, (a)) is supplied to the base electrode of transistor $Q_{23}$, whereas the signal to be modulated (FIG. 3, (d)) which is out of phase 180° with respect to that shown in FIG. 3. at (b) is supplied to the base electrode of transistor $Q_{22}$. Furthermore, since the signal to be modulated shown in FIG. 3 at (b) and being out of phase 180° with respect to the signal to be modulated which is applied to the base electrode of transistor $Q_{16}$ is applied to the base electrode of transistor $Q_{19}$, the emitter output of the PNP NAM circuit constituted by transistor $Q_{20}$ and $Q_{21}$ will have a wave form as shown in FIG. 3 at (g), and this output signal is supplied to the base electrode of transistor $Q_{25}$, that is, one input of the differential amplifier COMP. As described above, since a signal having a wave form as shown in FIG. 3 at (e) is applied to the base electrode of transistor $Q_{24}$ which constitutes the differential amplifier COMP together with transistor $Q_{25}$ and since a signal having a wave form as shown in FIG. 3 at (g) is applied to the base electrode of the other transistor $Q_{25}$, these two input signals are mixed together at the collector electrode of transistor $Q_{24}$ at the opposite phases, thus producing a modulated signal having a wave form as shown in FIG. 3 at (h).

Under the condition that the modulation signal is zero, the carrier leak is the sum of the difference in the base potentials of transistors $Q_{12}$ and $Q_{17}$, the difference in the base-emitter voltages $V_{BE}$ of transistors $Q_{12}$ and $Q_{17}$, the difference in the base-emitter voltages of transistors $Q_{14}$ and $Q_{15}$, the difference in the base-emitter voltages $V_{BE}$ of transistors $Q_{18}$ and $Q_{23}$, and the difference in the base-emitter voltage $V_{BE}$ of transistors $Q_{20}$ and $Q_{21}$, and it can approximately be expressed by the following equation, $$V_{B12} - V_{B17} + \Delta V_{BE} \times 4$$

where $V_{B12}$ represents the base voltage of transistor $Q_{12}$ and $V_{B17}$ the base voltage of transistor $Q_{17}$.

Thus, in order to minimize the carrier leak, it is necessary to construct the bias circuit such that the difference $V_{B12} - V_{B17}$ should be made as small as possible, and that the base-emitter voltage $V_{BE}$ should also be as small as possible.

Figure 1:
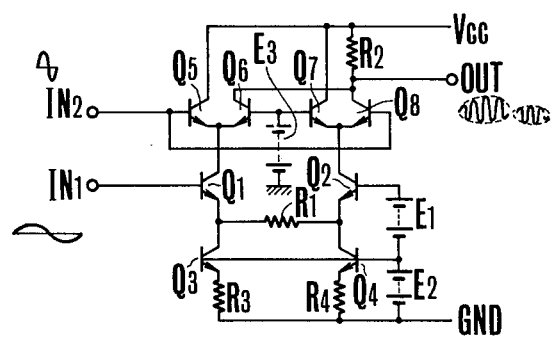
FIG. 1 is a connection diagram showing one example of a prior art modulation system.

The circuit shown in FIG. 2 is different from that shown in FIG. 1 in that the carrier leak is determined solely by the difference in the base-emitter voltages $V_{BE}$. Since the difference in the base-emitter voltages $V_{BE}$ can be reduced to less than several millivolts by fabricating the circuit with an integrated circuit, the circuit shown in FIG. 2 can fully manifest its performances by an integrated circuit. So long as the circuit is constructed to be symmetrical, the higher harmonics caused by the modulating operation can be cancelled by the common mode rejection ratio (CMRR) of the differential amplifier COMP constituted by transistors $Q_{24}$ and $Q_{25}$, thus producing a modulated output free from harmonic components. Since the circuit is constructed by a series of emitter follower connections and comprises combinations of PNP type and NPN type transistors, it is possible to provide sufficiently wide dynamic range even with a low voltage.

While in the foregoing description, NPN type transistor pairs $Q_A$, $Q_B$, $Q_C$ and $Q_D$ each emitter coupled, and PNP type transistor pairs $Q_E$ and $Q_F$ each emitter coupled have been used, it should be understood that the NPN type transistor pairs and the PNP type transistor pairs may be interchanged. More particularly, the emitter coupled NPN type transistor pairs $Q_A$ to $Q_D$ may respectively be substituted by PNP type transistor pairs and the emitter coupled PNP type transistor pairs $Q_E$ and $Q_F$ may respectively be substituted by NPN type transistor pairs with the same advantages. In the alternation, the polarity of the source should be reversed.

As above described, the invention provides a modulator of simple circuit construction which has a wide dynamic range and is capable of reducing carrier leak and higher harmonic components. Since the carrier leak can be reduced sufficiently without making any adjustment, it is possible to simplify the steps of adjustment in the overall fabrication.

The modulator of this invention can provide a wide dynamic range with a low source voltage as well as a sufficiently small carrier leak without making any adjustment by constructing the modulator with an integrated circuit. For this reason, the modulator of this invention is suitable for use in a portable color television camera operable with a low voltage battery, especially in the color coding unit wherein the carrier leak adversely affects the fidelity of the color.

What is claimed is:

1. A modulation system comprising;
   first, second, third and fourth transistor pairs, each emitter coupled;
   fifth and sixth transistor pairs, each emitter coupled;
   a differential amplifier;
   means for connected base electrodes of the transistors of said fifth transistor pair to respective emitter electrodes of said first and second transistor pairs;
   means for connecting base electrodes of the transistors of the sixth transistor pair to respective emitter electrodes of said third and fourth transistor pairs;
   means for connecting base electrodes of the transistors of said fifth transistor pair to respective emitter electrodes of said first and second transistor pairs;
   means for applying a clamped modulation signal to a base electrode of a first transistor of said first transistor pair and to a base electrode of a second transistor of said fourth transistor pair;
   means for applying a signal to be modulated to the base electrodes of respective second transistors of said first and third transistor pairs;
   means for applying direct current voltage to a base electrode of the second transistor of said second transistor pair and to a base electrode of the first transistor of said third transistor pair; and
   means for applying a signal to be modulated to respective base electrodes of first transistors of said second and fourth transistor pairs, the last mentioned signal to be modulated having a phase opposite to that of said first mentioned signal to be modulated supplied to the respective base electrodes of the second transistors of said first and third transistor pairs, thereby producing a modulated output signal on an output terminal of said differential amplifier.

2. A modulation system according to claim 1 wherein said differential amplifier also comprises a pair of bipolar transistors.

3. A modulation system according to claim 1 wherein various circuit elements of said modulation system are fabricated with integrated circuits.

* * * * *

UNITED STATES PATENT AND TRADEMARK OFFICE
CERTIFICATE OF CORRECTION

PATENT NO. : 4,278,954
DATED : 7/14/81
INVENTOR(S) : Hitachi Fujisaki

It is certified that error appears in the above-identified patent and that said Letters Patent are hereby corrected as shown below:

| COLUMN | LINE | |
|---|---|---|
| 3 | 2 | Delete "coastitute", insert --constitute-- |
| 6 | 9 | Delete "connected", insert --connecting-- |
| 6 | 15-17-18 | Delete "means for connecting base electrodes of the transistors of said fifth transistor pair to respective emitter electrodes of said first and second transistor pairs;", insert -- means for connecting emitter electrodes of said fifth and sixth transistor pairs to a pair of input terminals of said differential amplifier, respectively;-- |

Signed and Sealed this

Sixteenth Day of October 1984

[SEAL]

Attest:

Attesting Officer

GERALD J. MOSSINGHOFF

Commissioner of Patents and Trademarks